United States Patent
Kato et al.

[11] Patent Number: 6,136,634
[45] Date of Patent: Oct. 24, 2000

[54] METHOD OF MANUFACTURING SEMICONDUCTOR RESISTORS

[75] Inventors: Katsuyuki Kato; Hiroyuki Miwa; Hiroaki Ammo, all of Kanagawa, Japan

[73] Assignee: Sony Corporation, Tokyo, Japan

[21] Appl. No.: 09/086,208

[22] Filed: May 28, 1998

Related U.S. Application Data

[62] Division of application No. 08/861,527, May 22, 1997, Pat. No. 5,959,302.

[30] Foreign Application Priority Data

May 23, 1996 [JP] Japan ................................ 8-151723

[51] Int. Cl.[7] ................ H01L 21/8238; H01L 21/8222; H01L 29/76; H01L 29/00
[52] U.S. Cl. ...................... 438/200; 438/210; 438/329; 257/380; 257/379; 257/528
[58] Field of Search .............................. 438/233, 373, 438/384, 385, 532, 381, 238, 382, 383; 257/379, 380

[56] References Cited

U.S. PATENT DOCUMENTS

| | | | |
|---|---|---|---|
| 4,297,721 | 10/1981 | McKenny et al. .................. | 357/59 |
| 4,489,104 | 12/1984 | Lee ................................... | 427/101 |
| 4,762,801 | 8/1988 | Kapoor .............................. | 437/24 |
| 5,185,285 | 2/1993 | Hasaka .............................. | 437/60 |
| 5,212,108 | 5/1993 | Liu et al. ........................... | 437/60 |
| 5,316,973 | 5/1994 | Wang et al. ..................... | 437/188 |
| 5,356,825 | 10/1994 | Hozumi et al. .................. | 437/60 |
| 5,489,547 | 2/1996 | Erdeljac et al. .................. | 438/60 |

*Primary Examiner*—Donald L. Monin, Jr.
*Assistant Examiner*—S. H. Rao
*Attorney, Agent, or Firm*—Hill & Simpson

[57] ABSTRACT

A high-resistance polycrystalline Si resistor having a stable resistance value even when micro-sized and a low-resistance polycrystalline Si resistor having a sufficiently low desired resistance value wherein a polycrystalline Si film is formed on an insulation film located on a Si substrate, high-resistance-making ion implantation is applied to the entire surface and medium-resistance-making ion implantation is selectively applied to a medium-resistance-making region of the polycrystalline Si film. Low-resistance-making ion implantation is selectively applied to a low-resistance-making region of the polycrystalline Si film. The product is annealed to grow the polycrystalline Si film by solid-phase growth, the film is patterned to form a high-resistance polycrystalline Si resistor, medium-resistance polycrystalline Si resistor, and low-resistance polycrystalline Si resistor.

2 Claims, 4 Drawing Sheets

Fig. 5A
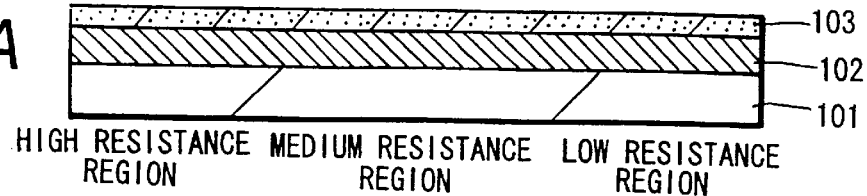
Fig. 5B
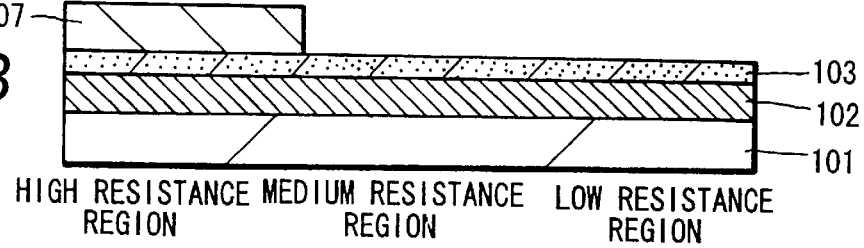
Fig. 5C
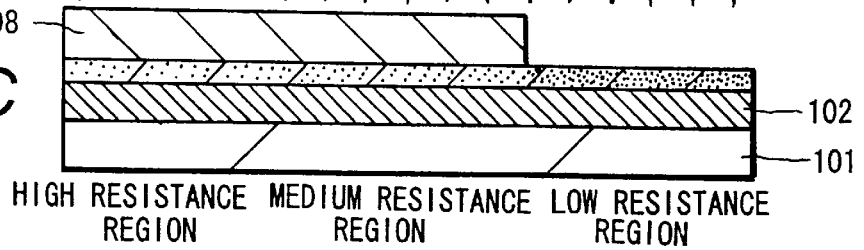
Fig. 5D
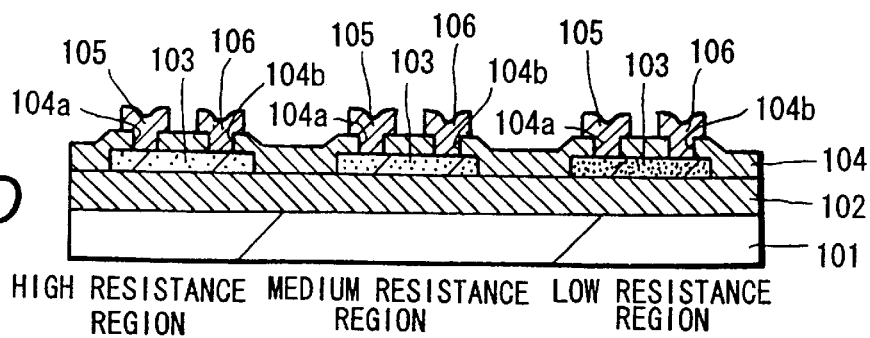

METHOD OF MANUFACTURING SEMICONDUCTOR RESISTORS

This application is a divisional of application Ser. No. 08/861,527 filed May 22, 1997, now U.S. Pat. No. 5,959,302.

BACKGROUND OF THE INVENTION

1. Field of the Invention

The present invention relates generally to the field of semiconductor devices and manufacturing methods, and, more particularly, the present invention relates to semiconductor devices and methods for manufacturing devices having a plurality of polycrystalline silicon resistors of different sheet resistances.

2. Description of the Related Art

IC circuits require precise resistor devices to allow the circuits to function properly and to operate within specified parameters. Typical resistors used in IC circuits are diffusion resistors which use an impurity-diffused layer formed in a silicon (Si) substrate and polycrystalline Si resistors which use a polycrystalline Si film formed on an oxide film or other insulation film material. Although polycrystalline Si resistors are slightly inferior to diffusion resistors in resistance controllability, they are advantageous in lower parasitic capacity, no FET effect and no bias restriction, and they are widely used in semiconductor devices using a polycrystalline Si film.

FIG. 4 illustrates a typical conventional polycrystalline Si resistor. As shown in FIG. 4, the polycrystalline Si resistor includes a polycrystalline Si film 103 of a predetermined configuration formed on an insulation film 102 located on an Si substrate 101. The polycrystalline Si film 103 is covered by an inter-layer insulation film 104 such as, for example, a silicon oxide film. The inter-layer insulation film 104 has openings 104a and 104b formed in portions aligned with opposite ends 103a and 103b of the polycrystalline Si film 103. The openings 104a and 104b permit electrodes 105 and 106 to extend into contact with the opposite ends 103a and 103b of the polycrystalline Si film 103. To ensure reliable contact with the electrodes 105, 106, the opposite ends 103a, 103b of the polycrystalline silicon film 103 are reduced in resistance by high-concentrated doping of impurities.

When a bipolar semiconductor device uses a polycrystalline Si resistor, for example, it would be advantageous that the polycrystalline Si film intended for making the polycrystalline Si resistor be commonly used also for making a base outlet electrode of an npn transistor. A typical polycrystalline Si film used for this purpose has a thickness from 100 to 200 nm. However, such a thin polycrystalline Si film cannot form a polycrystalline Si resistor with a sufficiently low resistance by simply increasing its impurity concentration.

By changing the impurity concentration of the polycrystalline Si film 103 in the polycrystalline Si resistor from one portion to another, a plurality of polycrystalline Si resistors having different sheet resistances can be made on a single IC. FIGS. 5A–5D shows views of a conventional process used for making a plurality of polycrystalline Si resistors that have different resistance values. This process makes three polycrystalline Si resistors having different sheet resistances (high resistance, medium resistance and low resistance) by selective ion implantation into the polycrystalline silicon film 103 by photolithography.

More specifically, this process first makes the polycrystalline Si film 103 on the insulation film 102 on the Si substrate 101 as shown in FIG. 5A, and then applies high-resistance ion implantation, which is an ion implantation for making a resistor with a high resistance, to the entire polycrystalline Si film 103 including a high-resistance region, medium-resistance region and low-resistance region where resistors with high, medium and low resistances, respectively, are to be made. The high-resistance ion implantation uses $BF_2^+$ as ion seeds, $BF_2^+$ implantation energy of 20 to 40 keV, and $BF_2^+$ dose amount of from approximately $1\times10^{14}$ cm$^{-2}$ to approximately $5\times10^{14}$ cm$^{-2}$.

After that, as shown in FIG. 5B, a resist pattern is formed only on the high-resistance region of the polycrystalline Si film 103 excluding the medium-resistance region and the low-resistance region. Using the resist pattern 107 as a mask, medium-resistance ion implantation, the ion implantation for making the resistor with a medium resistance, is applied to the medium-resistance region and the low-resistance region. The medium-resistance ion implantation uses $BF_2^+$ as ion seeds, implantation energy from 20 to 40 keV and dose amount of from approximately $1\times10^{15}$ cm$^{-2}$ to approximately $5\times10^{15}$ cm$^{-2}$.

After that, the resist pattern 107 is removed. Then, as shown in FIG. 5C, another resist pattern 108 is formed on the high-resistance region and the medium resistance region of the polycrystalline Si film 103 excluding the low-resistance region by photolithography. Using the resist pattern 108 as a mask, low-resistance ion implantation for making the resistor with a low resistance is applied to the low-resistance region of the polycrystalline Si film 103. The low-resistance ion implantation uses B+ as ion seeds, implantation energy of 5 to 20 keV, and dose amount of from approximately $1\times10^{15}$ cm$^{-2}$ to approximately $5\times10^{15}$ cm$^{-2}$.

The process results in applying only high-resistance ion implantation for the high-resistance region of the polycrystalline Si film 103, high-resistance ion implantation and medium-resistance ion implantation for the medium-resistance region of the polycrystalline Si film 103, and high-resistance ion implantation, medium-resistance ion implantation and low-resistance ion implantation for the low-resistance region of the polycrystalline Si film 103.

After that, the resist pattern 108 is removed, and the product is annealed. Then, as shown in FIG. 5D, the polycrystalline Si film 103 including the high- resistance region, medium-resistance region and low-resistance region is patterned into a predetermined shape by photolithography and etching to form the polycrystalline Si resistor with high resistance, the polycrystalline Si resistor with medium resistance and the polycrystalline Si resistor with low resistance. Further, after the inter-layer insulation film 104 is applied on the entire surface, openings 104a, 104b are formed at portions of the polycrystalline film 103 aligned with opposite ends of the high-resistance polycrystalline Si resistor, medium-resistance polycrystalline Si resistor and low-resistance polycrystalline Si resistor. Thereafter, electrodes 105 and 106 are brought into contact with the respective regions through the openings 104a and 104b. As a result, the intended high-resistance polycrystalline Si resistor, medium-resistance polycrystalline Si resistor and low-resistance polycrystalline Si resistor are obtained.

SUMMARY OF THE INVENTION

It is therefore an object of the invention to provide a semiconductor device and its manufacturing method that provides realization of a high-resistance polycrystalline silicon resistor having a stable resistance value even when micro-sized and also to achieve realization of a low-resistance polycrystalline silicon resistor having a desired, sufficiently low resistance.

According to a first aspect of the invention, a semiconductor device comprises a first polycrystalline silicon film and a second polycrystalline silicon film having a sheet resistance larger than that of the first polycrystalline silicon film. The first polycrystalline silicon film also has a crystalline grain size larger than that of the second polycrystalline silicon film.

In a first aspect of the invention, the crystalline grain size of the first polycrystalline silicon film, for example, is not less than 80 nm, and the crystalline grain size of said second polycrystalline silicon film is smaller than 80 nm. In a typical embodiment, the crystalline grain size of the first polycrystalline silicon film is 90 to 500 nm, and the crystalline-grain size of the second polycrystalline silicon film is from 20 to 70 nm. These crystalline grain sizes are values obtained by measurement using a transparent electronic microscope. The grain sizes may be larger when measured by an optical method such as through ultraviolet absorption.

In the first aspect of the invention, typical grain sizes of the first and second polycrystalline silicon films are in the range of 100 to 200 nm, for example. The sheet resistance of the first polycrystalline silicon film may be 200 $\Omega/\square$ or less, and that of the second polycrystalline silicon film may be 300 $\Omega/\square$ or more.

In a typical version of the first aspect of the invention, the first and second polycrystalline silicon films are made by patterning a common polycrystalline silicon film, and the first and second polycrystalline silicon films form polycrystalline silicon resistors.

According to a second aspect of the invention, a method is provided for manufacturing a semiconductor device that includes a first polycrystalline silicon film and a second polycrystalline silicon film having a sheet resistance larger than that of the first polycrystalline silicon film and a grain size smaller than that of the first polycrystalline silicon film, comprising the steps of: forming a polycrystalline silicon film for making the first polycrystalline silicon film on a substrate, and then applying a first ion implantation for making the second polycrystalline silicon film at a region for the second polycrystalline silicon of the polycrystalline silicon film; and selectively applying a second ion implantation for making the first polycrystalline silicon film in a region for the first polycrystalline silicon film.

In a second aspect of the invention, the first ion implantation may be applied also to the polycrystalline silicon film in the region for making the first polycrystalline silicon film. Typically, the first ion implantation uses $BF_2^+$ as ion seeds, and the second ion implantation uses both Si+ and B+ as ion seeds. A typical thickness of the polycrystalline film is 100 to 200 nm, for example. The dose amount of $BF_2^+$ of the first ion implantation is preferably about $5 \times 10^{14}$ cm$^{-2}$ or less to minimize the adverse affects of F contained in $BF_2^+$ for large-sizing of crystalline grains of the polycrystalline silicon film in the region for making a resistor with a low resistance.

In a typical embodiment of the second aspect of the invention, the first and second polycrystalline silicon films form polycrystalline silicon resistors. When the semiconductor device includes an npn transistor, the first polycrystalline silicon film may be used as the base outlet electrode of the non bipolar transistor.

In the semiconductor device having the above-mentioned construction according to the first aspect of the invention, since the first polycrystalline silicon film has a crystalline grain size larger than that of the second polycrystalline silicon film, the second polycrystalline silicon film having a smaller crystalline grain size can be used to obtain a high-resistance polycrystalline resistor having a stable resistance value even when micro-sized. Additionally, the first polycrystalline silicon film having a larger crystalline grain size can be used to obtain a low-resistance polycrystalline silicon resistor having a sufficiently low desired resistance value.

In the method for manufacturing a semiconductor device according to the second aspect of the invention, since the polycrystalline silicon film is made by solid-phase growth by annealing the product after the first ion implantation and the second ion implantation, the crystalline grain size of the first polycrystalline silicon film can be made larger than that of the second polycrystalline silicon film. As a result, the second polycrystalline silicon film having a smaller crystalline grain size can be used to obtain a high-resistance polycrystalline resistor having a stable resistance value even when micro-sized, and the fist polycrystalline silicon film having a larger crystalline grain size can be used to obtain a low-resistance polycrystalline silicon resistor having a sufficiently low desired resistance value.

BRIEF DESCRIPTION OF THE DRAWINGS

FIGS. 5A to 5D illustrate cross sectional views showing a conventional process for manufacturing a semiconductor device.

DESCRIPTION OF THE PREFERRED EMBODIMENTS

Figure 1A:
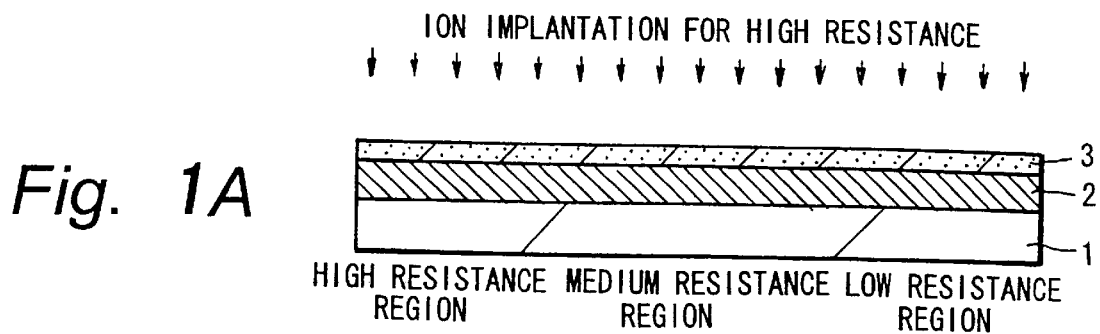
FIGS. 1A to 1D illustrate cross-sectional views of a process for manufacturing a semiconductor device according a first embodiment of the invention.

Embodiments of the invention are explained below with reference to the drawings. Identical or equivalent elements or parts are labeled with common reference numerals in all figures of the embodiments.

FIGS. 1A–1D show a method for fabricating a semiconductor device according to a first embodiment of the invention and, in particular, a process for making polycrystalline Si resistors in the semiconductor device. A process for making three kinds of polycrystalline Si resistors having a high resistance (for example, 1 k to 4.5 k $\Omega/\square$), medium resistance (for example 300 to 500 $\Omega/\square$) and low resistance (for example, 200 $\Omega/\square$ or less) is set forth.

In the first embodiment, as shown in FIG. 1A, a polycrystalline Si film 3 is formed on an insulation film 2, such as a silicon oxide film, on an Si substrate 1 by CVD. The polycrystalline Si film 3 may have a thickness from 100 to 200 nm, for example. High-resistance ion implantation for making a resistor with a high resistance is next applied to the entirety of the polycrystalline Si film 3 including a high-resistance region, medium-resistance region and low-resistance region where resistors with high, medium and low resistances are to be made. The high-resistance ion implantation may use $BF_2^+$ as ion seeds, an implantation energy of 20 to 40 keV and dose amount of from approximately $3\times10^{14}$ cm$^{-2}$ to approximately $5\times10^{14}$ cm$^{-2}$.

Figure 1B:
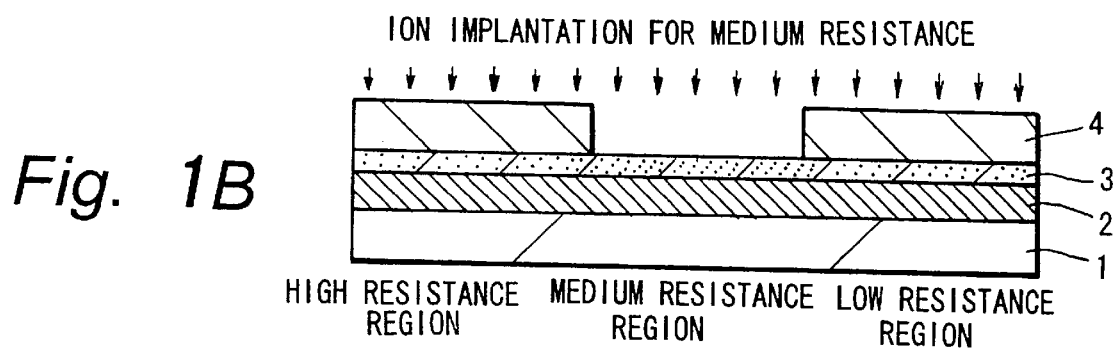

After that, as shown in FIG. 1B, a resist pattern 4 is formed on the medium-resistance region of the polycrystalline Si film 3 excluding the high-resistance region and the low-resistance region. Using the resist pattern 4 as a mask, medium-resistance ion implantation for making a resistor with a medium resistance is applied to the medium-resistance region of the polycrystalline Si film 3. The medium-resistance ion implantation may use $BF_2^+$ as ion seeds, an implantation energy of 20 to 40 keV and dose amount of from approximately $3\times10^{15}$ cm$^{-2}$ to approximately $5\times10^{15}$ cm$^{-2}$.

Figure 1C:
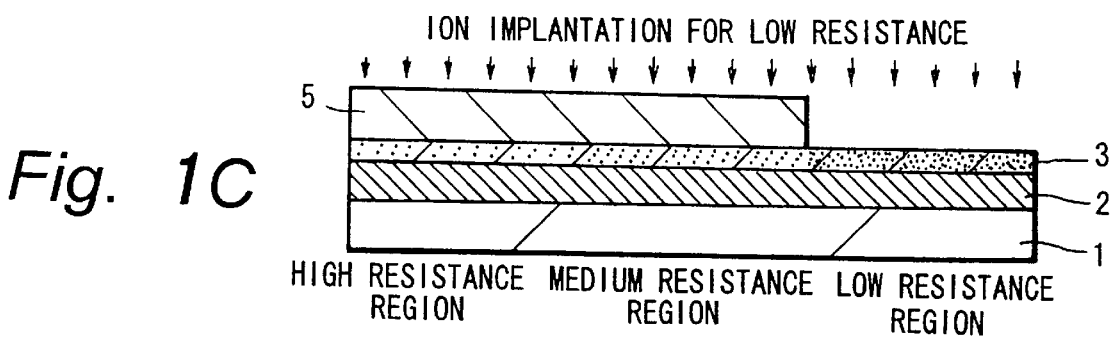

After the resist pattern 4 is removed, as shown in FIG. 1C, another resist pattern 5 is formed on the high-resistance region and the medium-resistance region of the polycrystalline Si film 3 excluding the low-resistance region by photolithography. Using the resist pattern as a mask, low-resistance ion implantation for making a resistor with a low resistance is applied to the low-resistance region of the polycrystalline Si film 3. The low-resistance ion implantation may use Si+ and B+ as ion seeds, an Si+ implantation energy of 50 to 80 keV, an Si+ dose amount of from approximately $1\times10^{15}$ cm$^{-2}$ to approximately $5\times10^{15}$ cm$^{-2}$, a B+ implantation energy of 5 to 15 keV, and B+ dose amount of from approximately $1\times10^{15}$ cm$^{-2}$ to approximately $3\times10^{15}$ cm$^{-2}$.

The above process results in applying only the high-resistance ion implantation to the high-resistance region of the polycrystalline Si film 3, high-resistance ion implantation and medium-resistance ion implantation to the medium-resistance region of the polycrystalline Si film 3, and high-resistance ion implantation and low-resistance ion implantation to the low-resistance region of the polycrystalline Si film 3. It should be noted here that the dose amount of $BF_2^+$ ions implanted to the low-resistance region of the polycrystalline Si film 3 is from approximately $3\times10^{14}$ cm$^{-2}$ to approximately $5\times10^{14}$ cm$^{-2}$, which is lower by a factor of ten than that of the conventional method shown in FIG. 5. This results in decreasing the dose amount of F which prevents enlargement of the crystalline grain size also by a factor of ten.

After the resist pattern 5 is removed, the product is annealed to grow the polycrystalline Si film 3 by solid-phase growth. The annealing is done for 30 to 300 minutes at temperatures in the range of 550° to 650° C. in an atmosphere of nitrogen ($N_2$) gas. During the solid-phase growth, since the concentration of F+ ions implanted into the low-resistance region of the polycrystalline Si film 3 is lower than the conventional process by a factor of ten, there is substantially no adverse affect of F+ preventing formation of large crystalline grains, and the crystalline grain size can be sufficiently increased in the low-resistance region of the polycrystalline Si film 3. As a result of the solid-phase growth by annealing, crystalline grain sizes as large as 90 to 500 nm, for example, can be made in the low-resistance region of the polycrystalline Si film while maintaining grain sizes ground 20 to 70 nm, for example, in the medium-resistance and high-resistance regions of the polycrystalline Si film 3. Annealing performed later may be commonly used as annealing for solid-phase growth.

Figure 1D:
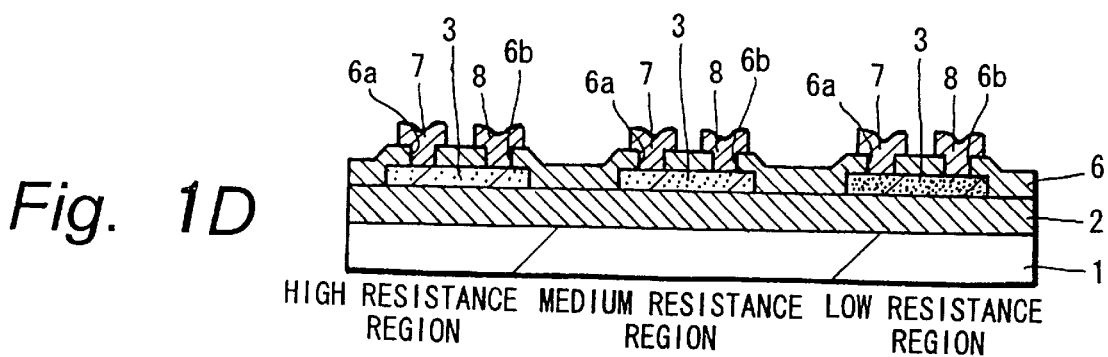

Next, as shown in FIG. 1D, the polycrystalline Si film 3 is patterned by photolithography and etching into a predetermined shape for the high-resistance, medium-resistance and low-resistance regions to form the high-resistance polycrystalline Si resistor, medium-resistance polycrystalline Si resistor and low-resistance polycrystalline Si resistor. After that, the inter-layer insulation film 6, such as, for example, Si oxide film, is formed on the entire surface of the product by CVD, for example, and selective portions of the inter-layer insulation film 6 aligned with opposite end portions of the high-resistance, medium-resistance, and low-resistance polycrystalline Si resistors are removed by etching to form openings 6a and 6b. After that, an Al film, for example, is formed on the entire surface by sputtering or vacuum evaporation. The Al film is thereafter patterned into a predetermined configuration by photolithography and etching to form electrodes 7 and 8 that extend through the opening 6a and 6b into contact with opposite end portions of the high-resistance, medium-resistance and low-resistance polycrystalline Si resistors.

Thus, the intended high-resistance polycrystalline Si resistor, medium-resistance polycrystalline Si resistor and low-resistance polycrystalline Si resistor are obtained.

Figure 2:
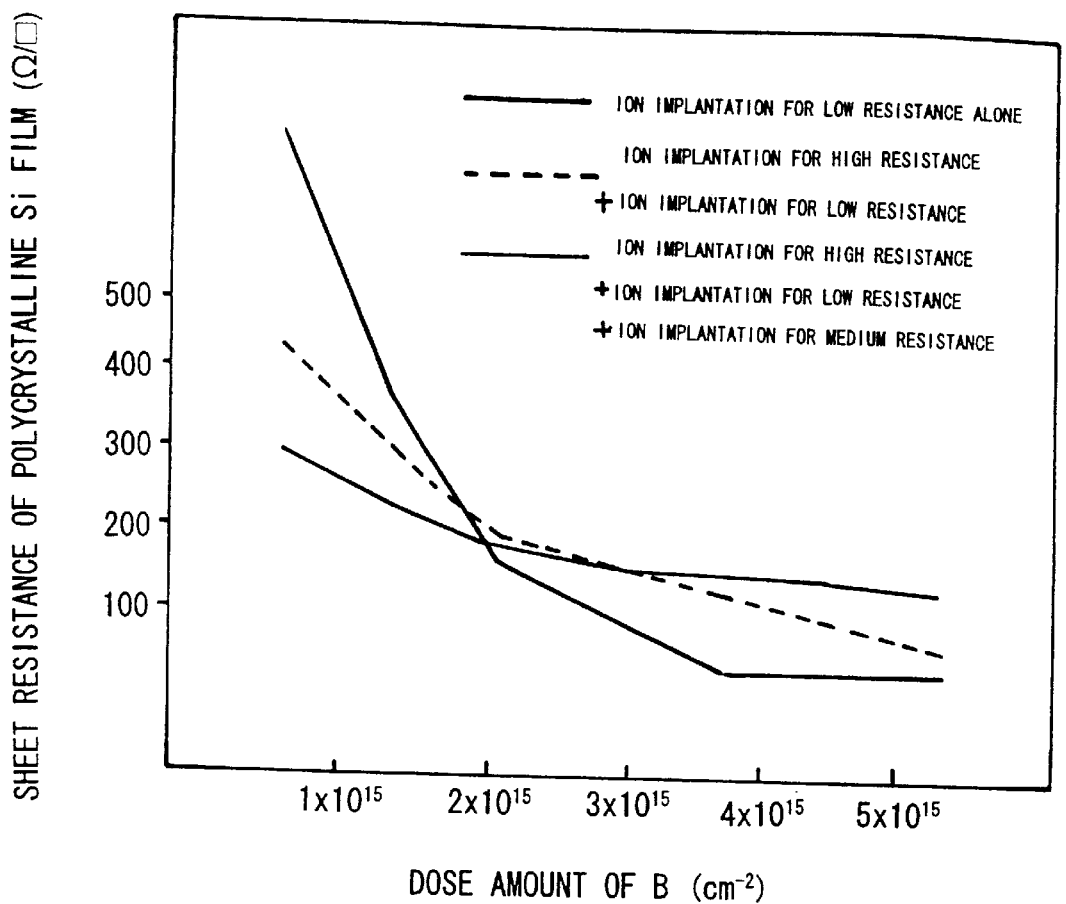
FIG. 2 is a graph showing a relationship between the dose amount of B and the sheet resistance of a polycrystalline Si film resulting from ion implantation applied to the first embodiment of the invention.

FIG. 2 shows the relationship between the dose amount of B and the sheet resistance of the polycrystalline Si film 3. In FIG. 2, the horizontal axis shows the dose amount of B (cm$^{-2}$) in low resistance ion implantation. In FIG. 2, the solid line curve with dots shows values obtained by low-resistance ion implantation alone, the broken line curve shows values obtained by both high-resistance ion implantation and low-resistance ion implantation, and the thin solid line curve shows values obtained by high-resistance ion implantation, medium-resistance ion implantation and low-resistance ion implantation.

It is understood from FIG. 2 that the polycrystalline Si film with the lowest sheet resistance can be obtained by using the polycrystalline Si film 3 subjected to low-resistance ion implantation alone. FIG. 2 also shows that the polycrystalline Si film 3 represents a lower sheet resistance when processed by high-resistance ion implantation and low-resistance ion implantation than that processed by high-resistance ion implantation, low-resistance ion implantation and low-resistance ion implantation. Since both are identical in number of steps, the former is most advantageous from a general point of view.

As explained above, the first embodiment of the invention can attain a sufficient increase of the crystalline grain size of a portion of the polycrystalline Si film 3 for forming the low-resistance polycrystalline Si resistor with respect to the crystalline grain size of the other portion of the polycrystalline Si film 3 for forming the high-resistance and medium-resistance polycrystalline Si resistors. Thus, the embodiment can stabilize the resistance values of the high-resistance and medium-resistance polycrystalline Si resistors and can decrease the resistance value of the low-resistance polycrystalline Si resistor to a sufficiently low desired value.

The method according to the first embodiment finds its optimum application in semiconductor devices using polycrystalline Si resistors, such as bipolar semiconductor devices and bipolar CMOS semiconductor devices. In bipolar semiconductor devices and bipolar CMOS semiconductor devices, the polycrystalline Si film common to the polycrystalline Si film 3 has a low sheet resistance for forming the low-resistance polycrystalline Si resistor as a base electrode of an npn transistor to simplify the manufacturing process.

FIGS. 3A–3D show another method for manufacturing a semiconductor device as a second embodiment of the invention and, in particular, illustrates a process for making polycrystalline Si resistors in a semiconductor device. Here again, explanation is made of a process for making three kinds of polycrystalline Si resistors having a high resistance (for example, 1 k to 4.5 k Ω/□), medium resistance (for example 300 to 500 Ω/□) and low resistance (for example, 200 Ω/□ or less).

Figure 3A:
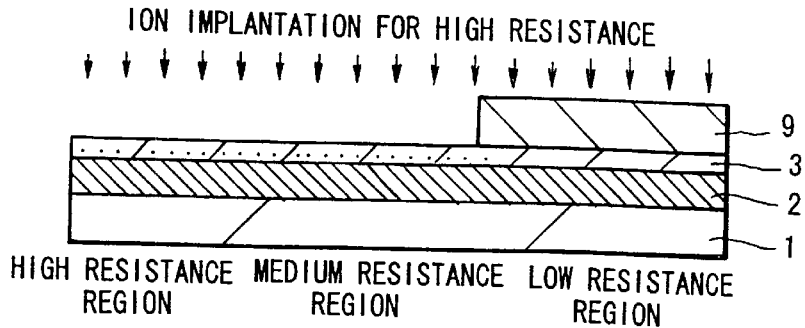
FIGS. 3A to 3D illustrate cross-sectional views showing a process for manufacturing a semiconductor device according a second embodiment of the invention.

In the second embodiment, as shown in FIG. 3A, a polycrystalline Si film 3 is formed on an insulation film 2, such as a silicon oxide film, on an Si substrate 1 by CVD. The polycrystalline Si film 3 may have a thickness from 100 to 200 nm, for example. After a resist pattern 9 is formed only on the low-resistance region of the polycrystalline Si film 3 excluding the high-resistance and medium-resistance regions by photolithography, high-resistance ion implantation is applied to the high-resistance region and the medium-resistance region of the polycrystalline Si film 3 using the resist pattern 9 as a mask. The high-resistance ion implantation may use $BF_2^+$ as ion seeds, $BF_2^+$ implantation energy of 20 to 40 keV, and $BF_2^+$ dose amount of approximately $1\times10^{15}$ to approximately $5\times10^{14}$ cm$^{-2}$ and is preferably from $3\times10^{15}$ cm$^{-2}$ to $5\times10^{15}$ cm$^{-2}$.

Figure 3B:
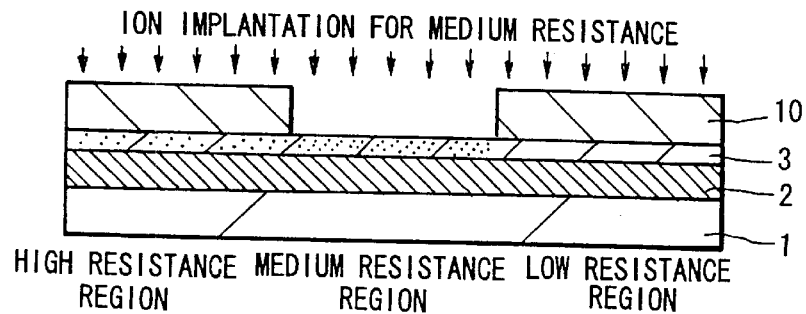

Then, the resist pattern 9 is removed, and another resist pattern 10 is formed on the high-resistance and low-resistance regions of the polycrystalline Si film 3 excluding the medium-resistance region by photolithography as shown in FIG. 3B. Using the resist pattern 10 as a mask, medium-resistance ion implantation is applied to the medium-resistance region of the polycrystalline Si film 3. The medium-resistance ion implantation may use $BF_2^+$ as ion seeds, an implantation energy of 20 to 40 keV, and dose amount of from approximately $1\times10^{15}$ cm$^{-2}$ to approximately $5\times10^{15}$ cm$^{-2}$ and is preferably from $3\times10^{15}$ cm$^{-2}$ to $5\times10^{15}$ cm$^{-2}$.

Figure 3C:
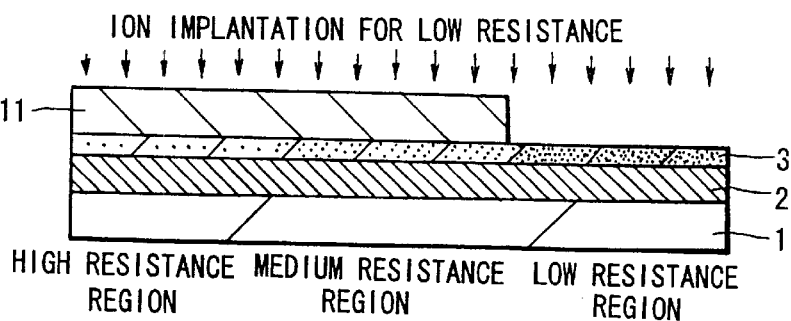

Then, the resist pattern 10 is removed, and another resist pattern 11 is formed on the medium-resistance region of the polycrystalline Si film 3 excluding the low-resistance and high-resistance regions by photolithography as shown in FIG. 3C. Using the resist pattern 11 as a mask, low-resistance ion implantation is applied to the low-resistance region of the polycrystalline Si film 3. The low-resistance ion implantation may use $B^+$ and $Si^+$ seeds, an implantation energy of 5 to 20 keV, preferably 5 to 15 keV and dose amount of from approximately $1\times10^{15}$ cm$^{-2}$ to approximately $5\times10^{15}$ cm$^{-2}$ and preferably from $1\times10^{15}$ to $3\times10^{15}$ cm$^{-2}$ an $Si^+$ implantation energy of 50 to 80 KeV and $Si^+$ dose amount of from approximately $1\times10^{15}$ cm$^{-2}$ to approximately $5\times10^{15}$ cm$^{-2}$ and preferably from $1\times10^{15}$ to $3\times10^{15}$ cm$^{-2}$.

The above process results in applying only the high-resistance ion implantation to the high-resistance region of the polycrystalline Si film 3, high-resistance ion implantation and medium-resistance ion implantation to the medium-resistance region of the polycrystalline Si film 3, and only low-resistance ion implantation to the low-resistance region of the polycrystalline Si film 3. It should be noted that $BF_2^+$ is not ion-implanted into the low-resistance region of the polycrystalline Si film 3 and that fluorine which may disturb large-size growth of crystalline grains do not enter in the low-resistance region.

Then, the resist pattern 11 is removed, and the product is annealed to grow the polycrystalline Si film 3 by solid-phase growth. The annealing conditions may be the same as those of the first embodiment. During the solid-phase growth, since fluorine is not introduced into the low-resistance region of the polycrystalline Si film 3, the prevention of large-size growth of crystalline grains by fluorine can be eliminated, and crystalline grains are grown sufficiently large in the low-resistance region of the polycrystalline Si film 3.

As a result, like the first embodiment, crystalline grain sizes as large as 90 to 500 nm, for example, can be made in the low-resistance region of the polycrystalline Si film while maintaining crystalline grain sizes around 20 to 70 nm, for example, in the medium-resistance and high-resistance regions of the polycrystalline Si film 3. In this case, the sheet resistance of the low-resistance region of the polycrystalline Si film 3 is 200 Ω/□ or less, and the sheet resistances of the low-resistance and high-resistance regions of the polycrystalline Si film 3 are 300 Ω/□ or more.

Figure 3D:
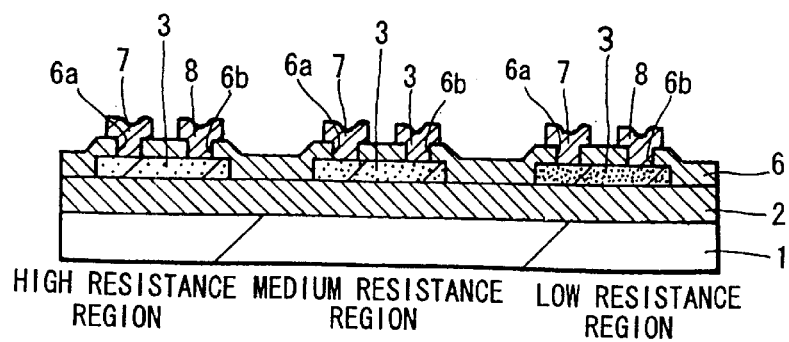

After that, through the same steps as those of the first embodiment, the intended high-resistance-polycrystalline Si resistor, medium-resistance polycrystalline Si resistor and low-resistance polycrystalline Si resistor are obtained as shown in FIG. 3D. Also the second embodiment promises the same advantages as those of the first embodiment. The description of the insulating film 6, the openings 6a and 6b formed therein, and the electrodes 7 and 8 which extend through the openings 6a and 6b for FIG. 1D is applicable for like numbered parts in FIG. 3D and so is not repeated.

Although the invention has been shown and described with respect to preferred embodiments thereof, it should be understood that the invention is not limited to the illustrated examples but includes various changes or modifications within the spirit and scope of the invention.

For example, numerical values suggested in the description of the first and second embodiments are exemplary only, and may be modified appropriately. In some cases, other appropriate materials may be used as ion seeds, other than those used in the first and second embodiments.

Figure 4:
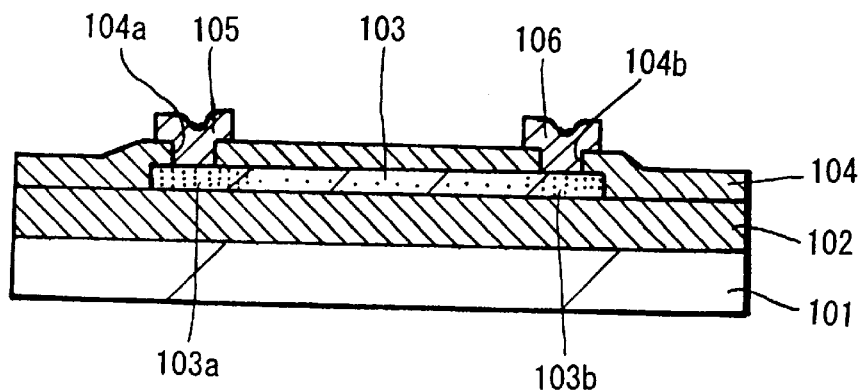
FIG. 4 is a cross-sectional view showing a conventional polycrystalline Si resistor.

The first and second embodiments as shown in FIGS. 1A–1D and 3A–3D may include the same step used in the conventional polycrystalline Si resistors shown in FIG. 4, namely, the step of doping high-concentrated impurities into opposite ends of the polycrystalline Si film 3 (corresponding to polysilicon Si film 103 of FIG. 4) in contact with the electrodes 7 and 8 (corresponding to electrodes 105 and 106 of FIG. 4) for the purpose of decreasing the resistance of the end portions to ensure reliable contact thereof with the electrodes.

As described above, the semiconductor device according to the invention promises both a high-resistance polycrystalline silicon resistor with a reliable resistance value even when micro-sized and a low-resistance polycrystalline silicon resistor with a sufficiently low desired resistance value. Also the manufacturing method according to the invention promises both a high-resistance polycrystalline silicon resistor with a reliable resistance value even when micro-sized and a low-resistance polycrystalline silicon resistor with a sufficiently low desired resistance value.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. A method for manufacture of a semiconductor device, comprising the steps of:
   providing a substrate;
   forming a polycrystalline silicon film on a major surface of said substrate, said polycrystalline silicon film having a thickness of 100 to 200 mn;
   defining first, second and third regions of said polycrystalline silicon film;
   ion implanting at least said first and second regions of said polycrystalline silicon film using $BF_2^+$ at a level for high resistance, said ion implanting of said first and second regions being performed at an implantation energy of 20 k to 40 keV and a dose of $1\times10^{15}$ to $5\times10^{14}$ cm$^{-2}$;

masking said third region and said first region;

ion implanting said second region of said polycrystalline silicon film using BF$_2^+$ at a level for medium resistance, said ion implanting of said second region being performed at an implantation energy of 20 k to 40 keV and a dose of $1\times10^{15}$ to $5\times10^{15}$ cm$^{-2}$;

masking said second region and said first region;

ion implanting said third region of said polycrystalline silicon film using Si$^+$ and B$^+$ at a level for low resistance, said ion implanting of said third region being performed at an Si$^+$ implantation energy of 50 to 80 keV and a dose for the Si$^+$ of $1\times10^{15}$ to $5\times10^{15}$ cm$^{-2}$ and at a B$^{30}$ implantation energy of 5 k to 15 keV and a dose for the B$^+$ of $1\times10^{15}$ to $3\times10^{15}$ cm$^{-2}$; and annealing for 30 to 300 minutes at a temperature of 550 to 650° C. to provide a crystalline grain size of 20 to 70 nm for the first and second regions and a crystalline grain size of 90 to 500 nm for the third region; and forming resistors of said polycrystalline silicon film, including:
forming a high resistance resistor of said first region of a resistance of 1 k to 4.5 k Ω/□,
forming a medium resistance resistor of said second region of a resistance of 300 to 500 Ω/□, and
forming a low resistance resistor of said third region of a resistance of not more than 200 Ω/□.

2. A method for manufacture of a semiconductor device, comprising the steps of:

providing a substrate;

forming a polycrystalline silicon film on a major surface of said substrate, said polycrystalline silicon film being of a thickness of 100 to 200 nm;

defining first, second and third regions of said polycrystalline silicon film;

masking said third region;

ion implanting at least said first and second regions of said polycrystalline silicon film using BF$_2^+$ at a level for high resistance, said ion implanting of said first and second regions being performed at an implantation energy of 20 k to 40 keV and a dose of $1\times10^{15}$ to $5\times10^{14}$ cm$^{-2}$;

masking said third region and said first region;

ion implanting said second region of said polycrystalline silicon film using BF$_2^+$ at a level for medium resistance, said ion implanting of said second region being performed at an implantation energy of 20 k to 40 keV and a dose of $1\times10^{15}$ to $5\times10^{15}$ cm$^{-2}$;

masking said second region and said first region;

ion implanting said third region of said polycrystalline silicon film using Si$^+$ and B$^+$ at a level for low resistance, said ion implanting of said third region being performed at an Si$^+$ implantation energy of 50 k to 80 keV and a dose for the Si$^+$ of $1\times10^{15}$ to $5\times10^{15}$ cm$^{-2}$ and at a B$^+$ implantation energy of 5 k to 20 keV and a dose for the B$^+$ of $1\times10^{15}$ to $5\times10^{15}$ cm$^{-2}$;

annealing to produce crystalline grain sizes of 90 to 500 nm in said third region and crystalline grain sizes of 20 to 70 nm in the first and second regions; and forming resistors of said polycrystalline silicon film, including:
forming a high resistance resistor of said first region,
forming a medium resistance resistor of said second region, said first and second regions having a sheet resistance of at least 300 Ω/□, and
forming a low resistance resistor of said third region, said third region having a sheet resistance of not more than 200 Ω/□.

* * * * *